US008648252B2

(12) United States Patent
Thomsen et al.

(10) Patent No.: US 8,648,252 B2
(45) Date of Patent: *Feb. 11, 2014

(54) SOLAR CELL USING LOW IRON HIGH TRANSMISSION GLASS AND CORRESPONDING METHOD

(75) Inventors: Scott V. Thomsen, South Lyon, MI (US); Richard Hulme, Rochester Hills, MI (US); Leonid M. Landa, Brownstown, MI (US); Ksenia A. Landa, Brownstown, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1764 days.

This patent is subject to a terminal disclaimer.

(21) Appl. No.: 11/373,490

(22) Filed: Mar. 13, 2006

(65) Prior Publication Data

US 2007/0215205 A1 Sep. 20, 2007

(51) Int. Cl.
*H01L 31/00* (2006.01)

(52) U.S. Cl.
USPC ............................................. 136/259

(58) Field of Classification Search
None
See application file for complete search history.

(56) References Cited

U.S. PATENT DOCUMENTS

| | | | |
|---|---|---|---|
| 4,298,389 A | 11/1981 | Johnson et al. |
| 4,510,344 A | 4/1985 | Berman |
| 4,792,536 A | 12/1988 | Pecoraro et al. |
| 4,806,436 A | 2/1989 | Tada et al. |
| 5,214,008 A | 5/1993 | Beckwith et al. |
| 5,401,287 A | 3/1995 | Pecoraro et al. |
| 5,674,791 A | 10/1997 | Amundson, Jr. |
| 5,883,030 A | 3/1999 | Bako et al. |
| 5,964,962 A | 10/1999 | Sannomiya et al. |
| 5,977,477 A | 11/1999 | Shiozaki |
| 6,372,327 B1 | 4/2002 | Burnham et al. |
| 6,403,509 B2 | 6/2002 | Cochran et al. |
| 6,407,021 B1 | 6/2002 | Kitayama et al. |
| 6,495,482 B1 | 12/2002 | de Sandro et al. |
| 6,498,118 B1 | 12/2002 | Landa et al. |
| 6,503,860 B1 | 1/2003 | Dickinson et al. |
| 6,506,622 B1 | 1/2003 | Shiozaki |
| 6,521,558 B2 | 2/2003 | Landa et al. |

(Continued)

FOREIGN PATENT DOCUMENTS

EP  1 116 699  7/2001
EP  1 118 597  7/2001

(Continued)

OTHER PUBLICATIONS

Machine Translation Hashimoto (JP 11298030).*

(Continued)

*Primary Examiner* — Jennifer Michener
*Assistant Examiner* — Dustin Q Dam
(74) *Attorney, Agent, or Firm* — Nixon & Vanderhye P.C.

(57) ABSTRACT

A high transmission low iron glass, that is highly oxidized, is provided for use in solar cells or the like. In certain example embodiments, the glass composition used for the glass is a low-iron type glass composition which is highly oxidized thereby permitting the glass to realize a combination of high visible transmission (Lta or $T_{vis}$), high ultraviolet (UV) and/or infrared (IR) transmission, and high total solar (TS) transmission. These features may be achieved without the need for antimony in certain example instances. The glass substrate used in a solar cell may be patterned in certain example embodiments of this invention.

19 Claims, 3 Drawing Sheets

(56) References Cited

U.S. PATENT DOCUMENTS

| | | |
|---|---|---|
| 6,573,207 B2 | 6/2003 | Landa et al. |
| 6,610,622 B1 | 8/2003 | Landa et al. |
| 6,716,780 B2 | 4/2004 | Landa et al. |
| 6,776,007 B2 | 8/2004 | Hirota et al. |
| 6,796,146 B2 | 9/2004 | Burnham |
| 6,846,760 B2 | 1/2005 | Siebers et al. |
| 6,949,484 B2 | 9/2005 | Landa et al. |
| 7,557,053 B2 | 7/2009 | Thomsen et al. |
| 7,700,869 B2 | 4/2010 | Thomsen et al. |
| 7,700,870 B2 | 4/2010 | Thomsen et al. |
| 2002/0102388 A1 | 8/2002 | Burnham |
| 2003/0180476 A1 | 9/2003 | Yamashita et al. |
| 2003/0216241 A1 | 11/2003 | Landa et al. |
| 2004/0121896 A1 | 6/2004 | Landa et al. |
| 2004/0180775 A1 | 9/2004 | Landa et al. |
| 2004/0209757 A1 | 10/2004 | Landa et al. |
| 2005/0188725 A1 | 9/2005 | Tullman et al. |

FOREIGN PATENT DOCUMENTS

| | | | |
|---|---|---|---|
| EP | 1118597 A1 | * | 7/2001 |
| EP | 1 281 687 | | 2/2003 |
| JP | 01-239037 | | 9/1989 |
| JP | 07-122764 | | 5/1995 |
| JP | 08-026767 | | 1/1996 |
| JP | 11-60269 | | 3/1999 |
| JP | 11298030 A | * | 10/1999 |
| WO | WO 95/13993 | * | 5/1995 |
| WO | WO 2004/063106 | | 7/2004 |
| WO | WO 2006/083545 | | 8/2006 |
| WO | WO 2006/121601 | | 11/2006 |
| WO | WO 2007/106226 | | 9/2007 |

OTHER PUBLICATIONS

"Colored Glasses" Weyl; The Society of Glass Technology 1951, (4pgs).
"Colour Generation and Control in Glass", Bamford, Glass Science and Technology , 2, 1977 (3pgs).
"Photovoltaic Module Performance and Durability Following Long-Term Field Exposure", King et al., Sandia National Laboratories, (19pgs).
"The Redox Number Concept and Its Use by the Glass Technologist", Simpson et al., 2307 Glass Technology, vol. 19, No. 4 (Aug. 1978), pp. 82-85.
U.S. Appl. No. 11/122,218, filed May 5, 2005; Thomsen et al.
XP-002398521 "Glass Made Cover Solar Battery Rough Light Incidence Surface Flat Upper Portion Predetermined Surface Rough" (1pg), WPI/Derwent.
U.S. Appl. No. 11/049,292, filed Feb. 3, 2005; Thomsen et al.

* cited by examiner

Fig. 1

| Glass composition, wt.% | Regular clear | ExtraClear | Starfire | 1 | 2 | 3 | 4 | 5 | 6 | 7 |
|---|---|---|---|---|---|---|---|---|---|---|
| SiO2 | 71.67 | 71.61 | 73.71 | 72.12 | 71.77 | 72.62 | 73.10 | 73.49 | 72.73 | 73.09 |
| Al2O3 | 0.37 | 0.21 | 1.48 | 0.54 | 0.44 | 0.61 | 0.82 | 0.47 | 0.81 | 0.55 |
| Fe2O3 | 0.090 | 0.042 | 0.022 | 0.027 | 0.024 | 0.021 | 0.017 | 0.017 | 0.018 | 0.020 |
| CaO | 8.61 | 8.77 | 10.32 | 8.99 | 8.98 | 8.97 | 8.93 | 10.11 | 10.45 | 8.84 |
| MgO | 3.76 | 3.60 | 0.00 | 3.57 | 3.89 | 3.70 | 3.70 | 0.15 | 0.17 | 4.01 |
| Na2O | 13.58 | 13.70 | 14.35 | 13.84 | 13.82 | 13.65 | 13.24 | 13.88 | 13.69 | 14.12 |
| K2O | 0.14 | 0.06 | 0.02 | 0.07 | 0.05 | 0.06 | 0.01 | 0.32 | 0.01 | 0.02 |
| Li2O | 0.00 | 0.00 | 0.00 | 0.00 | 0.00 | 0.00 | 0.25 | 0.00 | 0.00 | 0.00 |
| SO3 | 0.17 | 0.20 | 0.13 | 0.31 | 0.32 | 0.32 | 0.33 | 0.34 | 0.37 | 0.29 |
| TiO2 | 0.04 | 0.02 | 0.01 | 0.02 | 0.01 | 0.017 | 0.01 | 0.01 | 0.01 | 0.02 |
| Cr2O3 | 0.0012 | 0.0009 | 0.0000 | 0.0000 | 0.0000 | 0.0000 | 0.0000 | 0.0000 | 0.0000 | 0.0000 |
| Co3O4 | 0.0000 | 0.0000 | 0.0000 | 0.0000 | 0.0000 | 0.0000 | 0.0000 | 0.0000 | 0.0001 | 0.0000 |
| CeO2 | 0.0000 | 0.0000 | 0.0000 | 0.0000 | 0.0000 | 0.0000 | 0.0000 | 0.0000 | 0.0000 | 0.035 |
| Spectral properties at 4 mm | | | | | | | | | | |
| %Tvis (E 903) | 90.01 | 91.25 | 91.35 | 91.40 | 91.51 | 91.63 | 91.75 | 91.78 | 91.74 | 91.83 |
| %Tvis (NEN 2675) | 89.91 | 91.15 | 91.25 | 91.31 | 91.42 | 91.52 | 91.67 | 91.66 | 91.63 | 91.75 |
| %Tsol (ISO 9050) | 84.84 | 88.55 | 89.85 | 90.49 | 90.95 | 91.22 | 91.52 | 91.66 | 91.64 | 91.82 |
| %Tsol (AM 1.5 Flabeg) | 84.64 | 88.25 | 89.67 | 90.23 | 90.76 | 91.02 | 91.34 | 91.47 | 91.43 | 91.66 |
| %UV (300-400) | 80.45 | 83.95 | 89.64 | 87.25 | 86.91 | 86.44 | 85.92 | 85.99 | 85.87 | 72.85 |
| L* (D 65 10 degr.) | 96.08 | 96.45 | 96.61 | 96.64 | 96.67 | 96.69 | 96.71 | 96.73 | 96.73 | 96.76 |
| a* (D 65 10 degr.) | -0.89 | -0.56 | -0.24 | -0.25 | -0.22 | -0.16 | -0.12 | -0.08 | -0.08 | -0.07 |
| b* (D 65 10 degr.) | 0.13 | 0.26 | 0.08 | 0.32 | 0.35 | 0.39 | 0.41 | 0.47 | 0.44 | 0.48 |
| %FeO (spectral) | 0.0204 | 0.0085 | 0.0046 | 0.0031 | 0.0018 | 0.0015 | 0.0009 | 0.0002 | 0.0002 | 0.0000 |

EXAMPLES for this Invention

SOLAR CELL USING LOW IRON HIGH TRANSMISSION GLASS AND CORRESPONDING METHOD

This invention relates to a high transmission low iron glass, which is highly oxidized, for use in solar cells or the like. A method is also provided. In certain example embodiments, the glass composition used for the glass is a low-iron type glass composition which is highly oxidized thereby permitting the glass to realize a combination of high visible transmission (Lta or $T_{vis}$), high infrared (IR) transmission, and high total solar (TS) transmission. The glass substrate used in a solar cell may be patterned in certain example embodiments of this invention.

BACKGROUND AND SUMMARY OF EXAMPLE EMBODIMENTS OF THE INVENTION

Solar cells are known in the art. A solar cell may include, for example, a photoelectric transfer film made up of one or more layers located between a pair of substrates or other layers. These layers may be supported by a glass substrate. Example solar cells are disclosed in U.S. Pat. Nos. 4,510,344, 4,806,436, 6,506,622, 5,977,477, and JP 07-122764, the disclosures of which are hereby incorporated herein by reference.

Substrates in solar cells (or photovoltaic devices) are sometimes made of glass. Glass that is fairly clear in color and highly transmissive to visible light is sometimes desirable. Glass raw materials (e.g., silica sand, soda ash, dolomite, and/or limestone) typically include certain impurities such as iron, which is a colorant. The total amount of iron present is expressed herein in terms of $Fe_2O_3$ in accordance with standard practice. However, typically, not all iron is in the form of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

It has been found that the use of a low-iron highly transparent (optionally patterned) glass is advantageous for solar cell applications. The use of the low-iron composition in combination with the patterned surface(s) of the glass substrate(s) has been found to be advantageous with respect to optical properties, thereby leading to increased solar efficiency of a solar cell.

U.S. Patent Document Nos. 2004/0209757, 2005/0188725 and U.S. Pat. No. 6,949,484 disclose clear glass compositions, and are hereby incorporated herein by reference. Unfortunately, the glasses of these patent documents are lacking in terms of total solar (TS) transmission. In particular, the glasses of these patent documents have undesirably low ultraviolet (UV) transmission characteristics which leads to low total solar (TS) transmission characteristics. For example, in 2004/0209757 Examples 1-11 have UV transmission (% UV) of no more than about 77% which leads to corresponding undesirably low total solar transmission (% TS) values. As another example, in 2005/0188725 Examples 1-5 have % FeO content and glass redox values which indicate that these glasses too would have less than desirable % UV and % TS characteristics. As yet another example, in U.S. Pat. No. 6,949,484 Examples 1-11 have rather low UV transmission (% UV) of no more than about 77% which leads to corresponding undesirably low total solar (% TS) values.

It will be appreciated that low % UV and % TS values are undesirable for glass substrates of solar cell type photovoltaic devices, especially for glass substrates on the light incident side of such devices. This is because in solar cell applications it is generally desirable for the glass substrate on the light incident side to allow through it as much radiation as possible (UV, IR and visible) so that the photoelectric transfer film of the solar cell can convert the radiation to as much current as possible. The less radiation allowed to pass through the glass substrate, the less current generated in the photovoltaic device.

In certain example embodiments of this invention, a glass is made so as to be highly transmissive to visible light, to be fairly clear or neutral in color, and to realize higher % IR and/or % UV, and thus higher % TS, characteristics than those discussed above in connection with U.S. Patent Document Nos. 2004/0209757, 2005/0188725 and U.S. Pat. No. 6,949,484. In certain example embodiments of this invention, a soda-lime-silica based glass is based on low iron raw materials, has a low amount of total iron, and is extremely oxidized so as to have no or very little ferrous ($Fe^{2+}$; FeO). This permits the glass to have a higher % UV transmission, and thus a higher % TS transmission, which are beneficial in solar cell applications. The glass substrate may be patterned, or not patterned, in different example embodiments of this invention.

In certain example embodiments, the glass substrate may have fairly clear color that may be slightly yellowish (a positive b* value is indicative of yellowish color). For example, in certain example embodiments, the patterned glass substrate may be characterized by a visible transmission of at least about 91%, a total solar/energy value of at least about 90%, more preferably at least about 91%, a transmissive a* color value of from −1.0 to +1.0 (more preferably from −0.5 to +0.5, and most preferably from −0.2 to 0), and a transmissive b* color value of from 0 to +1.5 (more preferably from +0.1 to +1.0, and most preferably from +0.2 to +0.6). These properties may be realized at an example non-limiting reference glass thickness of about 4 mm.

In certain example embodiments of this invention, there is provided a solar cell comprising: a glass substrate; first and second conductive layers with at least a photoelectric film provided therebetween; wherein the glass substrate is of a composition comprising:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.05% |
| % FeO | <=0.0038 |
| glass redox | <=0.12 |
| antimony oxide | 0 to less than 0.01% |
| cerium oxide | 0 to 0.2%, and | wherein the glass substrate has visible transmission of at least 91%, a transmissive a* color value of −1.0 to +1.0, a transmissive b* color value of from 0 to +1.5, % TS of at least 90%, and a UV transmission of at least 80%.

In other example embodiments of this invention, there is provided a solar cell comprising: a glass substrate; at least a first conductive layers and a photoelectric film; wherein the glass substrate is of a composition comprising or consisting essentially of:

| Ingredient | wt. % |
| --- | --- |
| $SiO_2$ | 67-75% |
| $Na_2O$ | 10-20% |
| CaO | 5-15% |
| % FeO | <=0.0038 |
| glass redox | <=0.12, and | wherein the glass substrate has visible transmission of at least 91%, a % TS of at least 90%, and a UV transmission of at least 80%.

In other example embodiments of this invention, there is provided a glass composition comprising or consisting essentially of:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.05% |
| % FeO | <=0.0038 |
| glass redox | <=0.12 |
| antimony oxide | 0 to less than 0.01% | wherein the glass at a reference thickness of about 4 mm has a visible transmission of at least 91%, a transmissive a* color value of −1.0 to +1.0, a transmissive b* color value of from 0 to +1.5, % TS of at least 90%, and a UV transmission of at least 80%.

In other example embodiments of this invention, there is provided a method of making a glass composition, the method comprising providing a glass batch that is processed so as to result in a glass comprising:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.05% |
| % FeO | <=0.0038 |
| glass redox | <=0.12 | wherein the glass batch has a batch redox of from +12 to +30 during the processing of manufacturing the glass so that the resulting glass is highly oxidized and has a glass redox of no more than 0.12.

DETAILED DESCRIPTION OF CERTAIN EXAMPLE EMBODIMENTS OF THIS INVENTION

Figure 1:
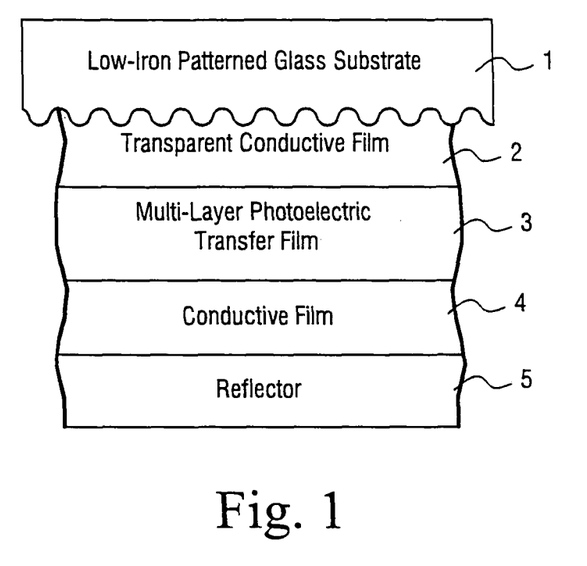
FIG. 1 is a cross sectional view of a solar cell according to an example embodiment of this invention.

An example solar cell is illustrated in cross section in FIG. 1. The solar cell (photovoltaic and/or thermal) includes, for example and without limitation, high transmission glass substrate 1, conductive film 2 which may be transparent, a photoelectric transfer film 3 which may include one or more layers, a rear or back electrode 4, and an optional reflector 5. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. Other semiconductors may instead be used for the active photoelectric film 3 that converts incident radiation to electric current. The electrodes 2, 4 may be of a transparent conductor such as conductive zinc oxide, or any other suitable material in certain example embodiments of this invention, and the reflector 5 may be of aluminum, silver or the like.

In certain example embodiments of this invention, one or both major surfaces (e.g., the interior surface only) of the glass substrate 1 may be patterned. Light tends to be refracted at interface(s) resulting from the patterning of the glass substrate 1, thereby causing light to proceed through the semiconductor layer(s) at an angle(s) such that the path is longer. As a result, more light can be absorbed by the solar cell and output current and/or efficiency can be improved/increased. In certain example embodiments of this invention, the patterned surface(s) of the glass substrate 1 may have a surface roughness (between peaks/valleys) of from about 0.1 to 1.5 μm, more preferably from about 0.5 to 1.5 μm. In certain example embodiments of this invention, the glass substrate 1 has one or more surfaces which are patterned so as to have a waviness feature defined therein. In the FIG. 1 embodiment, only one surface of the glass substrate 1 is patterned, although in other example embodiments both surfaces of the glass substrate may be patterned in a similar manner.

The optional patterning is preferably defined in the glass substrate 1 during the process of making the glass. An example technique for making such patterned glass is as follows. A furnace or melter is provided, as are first and second opposing rollers which define a nip therebetween. At least one of the rollers has a pattern defined in a surface thereof, where the pattern is made up of a plurality of peaks and valleys. A ribbon of glass exiting the furnace or melter is fed into the nip between the patterning rollers and reaches the nip at a temperature of from about 1,900 to 2,400 degrees F. At the nip, the pattern(s) from the roller(s) is transferred to the ribbon of glass, and then the patterned glass ribbon exits the nip at a temperature of from about 1,100 to 1,600 degrees F. After leaving the nip, the patterned glass ribbon is annealed, and may then be cut into a plurality of sheets. These glass sheets may or may not be heat treated (e.g., thermally tempered), and may be used in solar cell applications such as shown in FIG. 1. Example techniques for making the patterned glass substrate 1 are illustrated and described in U.S. Pat. Nos. 6,796,146 and/or 6,372,327 (except that different types of patterns are used), the disclosures of which are hereby incorporated herein by reference. When the glass substrate is patterned, it may be made on a pattern line; whereas when it is not patterned it may be made on a float line.

Certain glasses for patterned substrate 1 according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a slightly positive b* value) and/or have a high visible light transmission. These materials may either be present in the raw materials (e.g., small amounts of iron), or may be added to the base glass materials in the batch (e.g., cerium oxide).

Moreover, in addition to the ingredients in Table 1 above, other minor ingredients, including various conventional refining aids, such as $SO_3$ and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO. Moreover, from about 0.15 to 7% MgO, more preferably from about 1 to 7% MgO, is provided in the glass in certain example embodiments.

In certain example embodiments of this invention, the glass of substrate 1 is soda-lime-silica based (see base glass above) and is based on low iron raw materials such that the glass has a total iron ($Fe_2O_3$) content, in terms of wt. %, of no more than about 0.05%. In certain example embodiments, the glass has a total iron ($Fe_2O_3$) content of from about 0.010 to 0.045%, more preferably from about 0.010 to 0.035%, and most preferably from about 0.010 to 0.029%. This low iron content may result from the use of low-iron raw materials in making the glass, or alternatively may be added in certain example instances. Moreover, in certain example embodiments of this invention, the glass is extremely oxidized so as to have no or very little ferrous ($Fe^{2+}$; FeO). In certain example embodiments of this invention, the glass has a % FeO of no more than about 0.0038%, more preferably no more than about 0.0030%, even more preferably no more than about 0.0015%, more preferably no more than about 0.0010%. This low % FeO, in combination with other features, permits the glass to have a higher % UV transmission, and thus a higher % TS transmission, in combination with neutral color and high visible transmission, which are beneficial in solar cell applications.

In the past, antimony (Sb) has been used in glass in an attempt to oxidize the glass and achieve good characteristics. For instances, in certain instances, antimony was added to the glass in the form of antimony trioxide ($Sb_2O_3$), sodium antimonite ($NaSbO_3$), and/or sodium pyroantimonate ($Sb_2O_5$)). However, it has been found that antimony is undesirable in certain example instances in that it incompatible with certain float processes (e.g., tin bath) in certain instances. Thus, in certain example embodiments of this invention, the highly oxidized glass is achieved without the need for antimony (which includes antimony oxide). In certain example embodiments of this invention, the glass is free of antimony (which includes antimony oxide), or the glass has less than 0.01% antimony, more preferably no more than about 0.005% antimony, even more preferably no more than about 0.0005%, or 0.0001%, antimony, and still more preferably no antimony.

In certain preferred embodiments, there is no or very little cerium oxide in the glass. Cerium oxide is a UV absorber, and thus prevents UV from being transmitted through the glass. Thus, cerium oxide is not desired in certain solar cell embodiments of this invention. Accordingly, in certain example embodiments, the glass has no more than about 0.01% cerium oxide, more preferably no more than about 0.001% cerium oxide, still more preferably no more than about 0.0005% cerium oxide, and most preferably 0% cerium oxide. However, in alternative embodiments of this invention, it is possible to use a small amount of cerium oxide. For example and without limitation, in certain example embodiments of this invention, the glass contains, from about 0 to 0.2% cerium oxide, more preferably from about 0 to 0.1% cerium oxide, and possibly from about 0.001 to 0.09% cerium oxide. As with all material percentages herein, these amounts are in terms of wt. %. The term cerium oxide as used herein includes $Ce_2O_3$, $CeO_2$, or the like. In certain example instances, glasses including cerium oxide herein may be used in applications such as greenhouse glazings where UV protection is desired.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm, more preferably no more than 1 ppm, and possibly as low as 0 ppm of the element or material. It is noted that small amounts of titanium oxide may be included in certain instances.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color. Deep oxidation in certain example embodiments of this invention may be achieved by operations adjustments and chemically by introduction of sulfates in the form of one or more of salt cake (e.g., $Na_2SO_4$), Epsom salt (e.g., $MgSO_4 \times 7H_2O$) and/or gypsum in significant amounts and combination of one or more of these with potassium and/or sodium nitrate. The salt cake may be referred to in the final glass as $SO_3$. The high amounts of salt cake used in certain example embodiments, can be seen from the large amounts of $SO_3$ mentioned herein with respect to the final glass composition. In particular, one or more of these oxidizing elements are added to the glass batch in amount(s) sufficient to cause the glass batch to realize a batch redox of from about +12 to +30 in certain example embodiments of this invention, more preferably from about +15 to +30, and most preferably from about +20 to +30 in certain example embodiments. It is noted that batch redox is different than glass redox. Batch redox is known in the art as being generally based on the following. Each component of the batch is assigned a redox number, and the batch redox is calculated as the sum total of the same. The batch redox number is calculated before the glass is made, from the batch. A detailed discussion of "batch redox" and how it is determined is provided in *The redox number concept and its use by the glass technologist*, W. Simpson and D. D. Myers (1977 or 1978), which is incorporated herein by reference. In contrast with batch redox, glass redox is calculated after the glass has been made from spectral data or the like, and is a ratio of % FeO to total iron in the glass. The high batch redox discussed above causes iron in the ferrous state ($Fe^{2+}$; FeO) to oxidize to the ferric state ($Fe^{3+}$) and thus causes an amount of the strong blue-green colorant of ferrous iron ($Fe^{2+}$; FeO) to oxidize into the weaker yellow-green ferric iron colorant ($Fe^{3+}$) during the glass melt (note: some ferrous state iron may remain in the resulting glass). The aforesaid oxidation of the iron tends to reduce coloration of the glass, reduces % FeO, and causes visible transmission, % UV and % TS to increase. Any yellowish color caused by oxidation of iron into ferric state ($Fe^{3+}$) iron (i.e., positive b*) may be acceptable in solar cell applications and need not be compensated for by addition of other colorants thereby saving cost in certain example embodiments of this invention.

It will be appreciated by those skilled in the art that the high batch redox results in a glass with a lower "glass redox" value (i.e., less iron in the ferrous state FeO). In this regard, the proportion of the total iron in the ferrous state (FeO) is used to determine the redox state of the glass, and redox is expressed as the ratio $FeO/Fe_2O_3$, which is the weight percentage (%) of iron in the ferrous state (FeO) divided by the weight percentage (%) of total iron (expressed as $Fe_2O_3$) in the resulting glass. Due to at least the presence of the oxidizing agent(s), the glass redox of glass 1 according to certain example embodiments of this invention is very low as mentioned above, and the amount of iron in the ferrous state (FeO) will also be low as discussed above.

It is noted that glass according to certain example embodiments of this invention is often made via the known float process in which a tin bath is utilized. It will thus be appreciated by those skilled in the art that as a result of forming the glass on molten tin in certain exemplary embodiments, small amounts of tin or tin oxide may migrate into surface areas of the glass on the side that was in contact with the tin bath during manufacture (i.e., typically, float glass may have a tin oxide concentration of 0.05% or more (wt.) in the first few microns below the surface that was in contact with the tin bath).

In view of the above, glasses according to certain example embodiments of this invention achieve a neutral or substantially clear color, high visible transmission, high IR transmission, high UV transmission, and high total solar (TS) transmission. In certain embodiments, resulting glasses according to certain example embodiments of this invention may be characterized by one or more of the following transmissive optical, composition, or color characteristics (for the optics, an example non-limiting reference thickness of about 4 mm is used). Note that Lta is visible transmission %. It is noted that in the table below the L*, a* and b* color values are determined per Ill. D65, 10 degree Obs.

TABLE 2

CHARACTERISTICS OF EXAMPLE EMBODIMENTS

| Characteristic | General | More Preferred | Most Preferred |
|---|---|---|---|
| Lta (Lt D65): | >=85% | >=91% | >=91.5% |
| % TS (ISO 9050): | >=90% | >=91% | >=91.5% |
| % IR | >=80% | >=85% | >=90% (or >=91%) |
| % UV (300-400 nm): | >=80% | >=84% | >=85% (or 86%) |
| total iron ($Fe_2O_3$): | <=0.05% | 0.010-0.045% | 0.010-0.035% |
| % FeO (wt. %): | <=0.0038% | <=0.0030% | <=0.0015% (or 0.0010%) |
| Glass Redox: | <=0.12 | <=0.09 | <=0.08 or 0.06 |
| Batch Redox: | +12 to +30 | +15 to +30 | +20 to +30 |
| $SO_3$ | >=0.25 | 0.29-0.50 | >=0.30 (or >=0.31) |
| L* (Ill. D65, 10 deg.): | 90-99 | 94-99 | 95-98 |
| a* (Ill. D65, 10 deg.): | −1.0 to +1.0 | −0.5 to +0.5 | −0.25 to 0.0 |
| b* (Ill. D65, 10 deg.): | 0 to +1.5 | +0.1 to +0.8 | +0.2 to +0.6 |

The aforesaid characteristics of the glass substrate 1 are for the glass substrate alone, not the overall solar cell or solar cell module.

As can be seen from Table 2 above, glasses for substrate 1 of certain embodiments of this invention achieve desired features of fairly clear color and/or high visible transmission, with slightly positive b* color in certain embodiments, while not requiring iron to be eliminated from the glass composition. Moreover, high % UV and high % TS values are also achieved, which is advantageous for solar cell applications in that more radiation is permitted through the glass substrate 1 so that it can be converted to current or voltage. This may be achieved through the provision of the unique material combinations described herein, and/or process features discussed herein.

EXAMPLES 1-7

Figure 2:
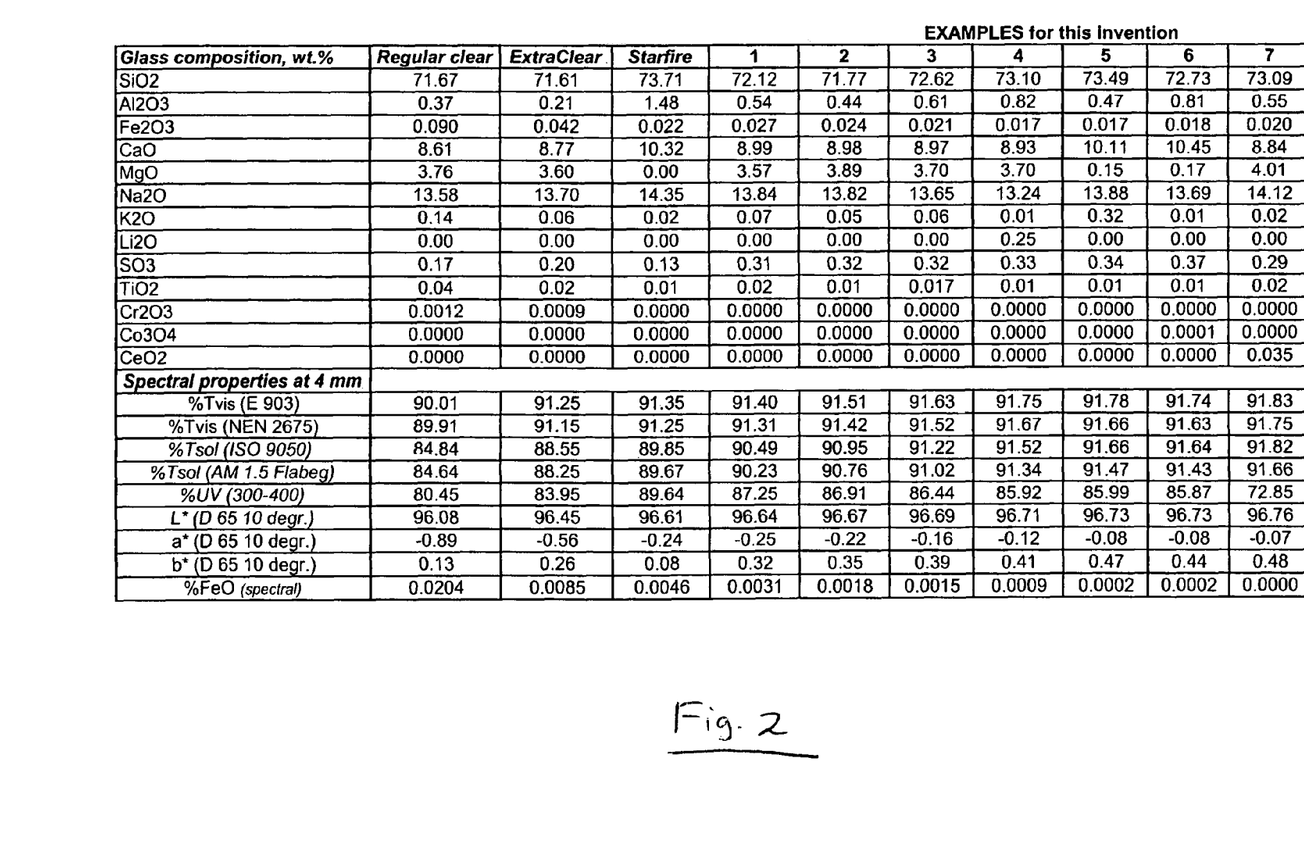
FIG. 2 is a chart illustrating the compositions and optical characteristics of glasses of Examples 1-7 of this invention, compared to conventional "Regular clear", "ExtraClear" and PPG "Starfire" glasses.

Example glasses for substrates 1 were made and tested according to example embodiments of this invention, as shown in FIG. 2. In particular, the seven right-most columns in FIG. 2 illustrate the respective compositions and optical characteristics of the glasses of Examples 1-7 of this invention. For purposes of comparison, conventional "Regular clear", "ExtraClear" and "Starfire" glasses and their characteristics are also provided at the left-hand portion of FIG. 2. It can be seen from FIG. 2 that the Examples of this invention had improved (i.e., higher) total solar (TS) and UV transmission values compared to the conventional "Regular clear" and "ExtraClear" glasses. Moreover, FIG. 2 illustrates that the Examples of this invention had much less FeO than did the conventional "Regular clear", "ExtraClear" and "Starfire" glasses, thereby permitting improved TS and/or UV features to be more easily achieved. In this regard, note the additional $SO_3$ in the Examples 1-7 compared to the conventional glasses, which indicates the presence of higher quantities of oxidizers in the batch and a higher batch redox, and thus reduced FeO % compared to the conventional glasses. With respect to the conventional Starfire glass, Examples 1-7 used much more oxidizing agent (e.g., see higher $SO_3$) which permitted the high TS and high UV features to be achieved even when MgO was used in the glass by greatly reducing % FeO (so that Examples 1-7 had a lower glass redox as well). It is noted that Examples 1-7 all had 0% antimony and 0% arsenic, which is what is preferred in certain example embodiments of this invention. Moreover, in making Examples 1-7, no reducing agents were present in the batch.

Figure 3:
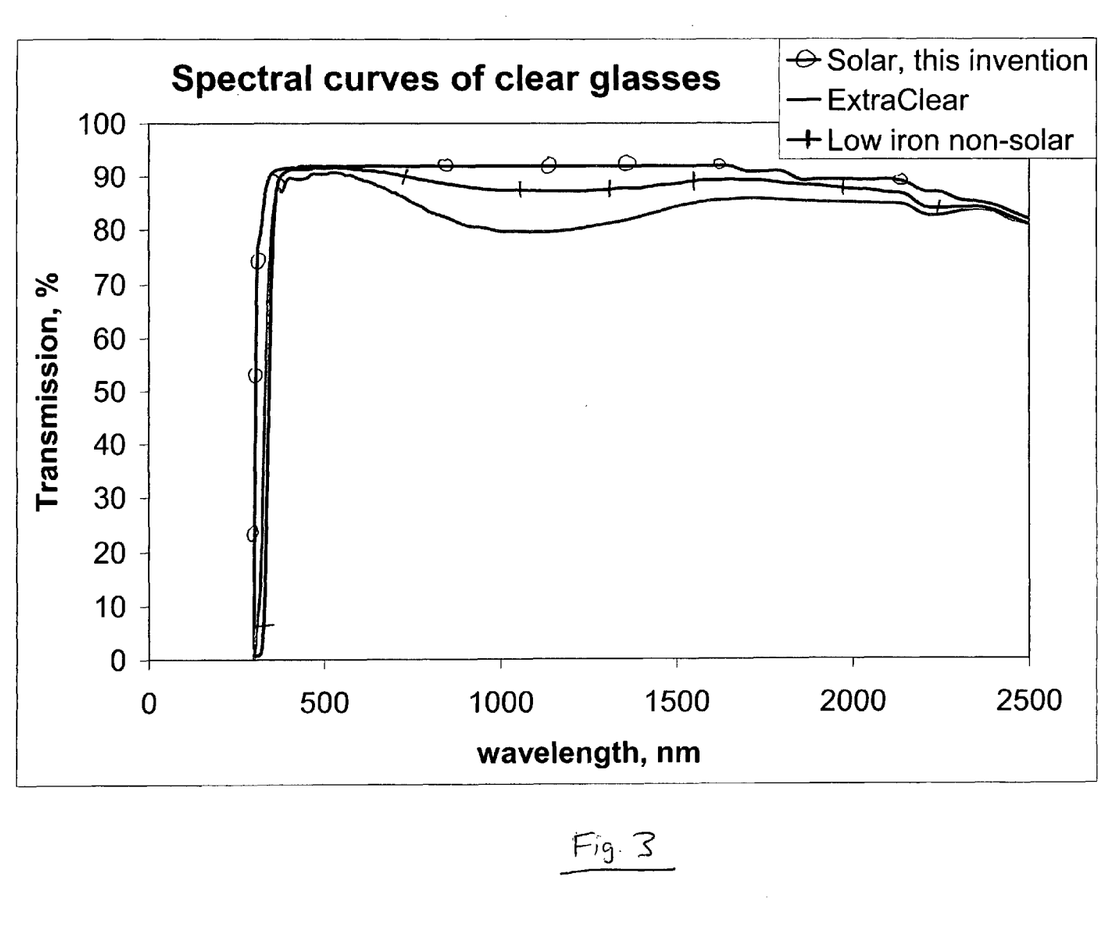
FIG. 3 is a transmission vs. wavelength graph comparing the transmission characteristics of an example of this invention with a pair of conventional high transmission clear glasses.

FIG. 3 is a transmission vs. wavelength graph comparing the transmission characteristics of an example of this invention with a pair of conventional high transmission clear glasses. It can be seen in FIG. 3 that according to certain example embodiments of this invention, glasses according to certain example embodiments of this invention has a higher transmission at wavelengths of from about 800-1500 than do the conventional glasses. This is reflected by the high % TS values discussed above.

Once given the above disclosure many other features, modifications and improvements will become apparent to the skilled artisan. Such features, modifications and improvements are therefore considered to be a part of this invention, the scope of which is to be determined by the following claims:

What is claimed is:
1. A solar cell comprising:
a glass substrate;
first and second conductive layers with at least a photoelectric film provided therebetween;
wherein the glass substrate is of a composition comprising:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.05% |
| % FeO | <=0.0038 |
| glass redox | <=0.12 |
| antimony oxide | 0 to less than 0.01% |
| cerium oxide | 0 to 0.1% | wherein the glass substrate has visible transmission of at least 91%, a transmissive a* color value of −1.0 to +1.0, a transmissive b* color value of from 0 to +1.5, % TS of at least 90%, and a UV transmission of at least 80%.

2. The solar cell of claim 1, wherein the glass substrate comprises:

| % FeO | <=0.0030% |
| --- | --- |
| glass redox | <=0.09 |
| IR transmission (% IR) | >=90%. |

3. The solar cell of claim 1, wherein the glass substrate has a % TS of at least 90.5%, a UV transmission of at least 84%, and comprises:

| % FeO | <=0.0015% |
| --- | --- |
| glass redox | <=0.08. |

4. The solar cell of claim 1, wherein the glass substrate comprises MgO and has no more than 0.01% cerium oxide.

5. The solar cell of claim 1, wherein the glass substrate contains no more than 2 ppm of at least two of erbium oxide, nickel oxide, cobalt oxide, neodymium oxide, chromium oxide, and selenium.

6. The solar cell of claim 1, wherein the glass substrate contains no more than 2 ppm of at least four of erbium oxide, nickel oxide, cobalt oxide, neodymium oxide, chromium oxide, and selenium; and wherein the glass substrate has no more than 0.01% cerium oxide.

7. The solar cell of claim 1, wherein the glass substrate contains no more than 2 ppm of at least five of erbium oxide, nickel oxide, cobalt oxide, neodymium oxide, chromium oxide, and selenium.

8. The solar cell of claim 1, wherein the glass substrate contains no more than 2 ppm of each of erbium oxide, nickel oxide, cobalt oxide, neodymium oxide, chromium oxide, and selenium.

9. The solar cell of claim 1, wherein the glass substrate comprises at least 0.25% $SO_3$.

10. The solar cell of claim 1, wherein the glass substrate comprises at least 0.29% $SO_3$.

11. A solar cell comprising:
a glass substrate;
at least a first conductive layers and a photoelectric film;
wherein the glass substrate is of a composition comprising:

| Ingredient | wt. % |
| --- | --- |
| $SiO_2$ | 67-75% |
| $Na_2O$ | 10-20% |
| CaO | 5-15% |
| % FeO | <=0.0038 |
| antimony oxide | 0 to less than 0.01% |
| glass redox | <=0.12 |
| cerium oxide | <=0.01% | wherein the glass substrate has visible transmission of at least 91%, a % TS of at least 90%, and a UV transmission of at least 80%.

12. The solar cell of claim 11, wherein the glass substrate comprises from 0.15 to 7% MgO, and comprises:

| | |
|---|---|
| % FeO | <=0.0030% |
| glass redox | <=0.09. |

13. The solar cell of claim 11, wherein the glass substrate has a % TS of at least 90.5%, a UV transmission of at least 84%, and comprises:

| | |
|---|---|
| % FeO | <=0.0015% |
| glass redox | <=0.08. |

14. The solar cell of claim 11, wherein the glass substrate contains no more than 2 ppm of each of erbium oxide, nickel oxide, cobalt oxide, neodymium oxide, chromium oxide, and selenium.

15. The solar cell of claim 11, wherein the glass substrate comprises at least 0.29% $SO_3$.

16. The solar cell of claim 11, wherein the glass substrate contains from about 0.010-0.045% total iron (expressed as $Fe_2O_3$), contains from 0-0.005% antimony oxide, and contains from 0-0.1% cerium oxide.

17. The solar cell of claim 11, wherein the glass substrate has a % TS of at least 91%, a visible transmission of at least 91.5%, and a UV transmission of at least 85%.

18. A glass composition comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.05% |
| % FeO | <=0.0038 |
| glass redox | <=0.12 |
| antimony oxide | 0 to less than 0.01% |
| cerium oxide | <=0.01% | wherein the glass at a reference thickness of about 4 mm has a visible transmission of at least 91%, a transmissive a* color value of −1.0 to +1.0, a transmissive b* color value of from 0 to +1.5, % TS of at least 90%, and a UV transmission of at least 80%.

19. The glass composition of claim 18, wherein the glass composition comprises 0-0.001% cerium oxide, a glass redox of no greater than 0.08, and % FeO of no more than about 0.0015%.

* * * * *